(12) United States Patent
Slade et al.

(10) Patent No.: US 11,101,059 B2
(45) Date of Patent: Aug. 24, 2021

(54) QUENCH DETECTION IN SUPERCONDUCTING MAGNETS

(71) Applicant: Tokamak Energy Ltd., Abingdon (GB)

(72) Inventors: Robert Slade, Abingdon (GB); Greg Brittles, Abingdon (GB)

(73) Assignee: Tokamak Energy Ltd, Abingdon (GB)

( * ) Notice: Subject to any disclaimer, the term of this patent is extended or adjusted under 35 U.S.C. 154(b) by 0 days.

(21) Appl. No.: 16/497,998

(22) PCT Filed: Mar. 27, 2018

(86) PCT No.: PCT/GB2018/050800
§ 371 (c)(1),
(2) Date: Sep. 26, 2019

(87) PCT Pub. No.: WO2018/178653
PCT Pub. Date: Oct. 4, 2018

(65) Prior Publication Data
US 2020/0058422 A1    Feb. 20, 2020

(30) Foreign Application Priority Data

Mar. 31, 2017 (GB) ...................... 1705214
Oct. 10, 2017 (GB) ...................... 1716581

(51) Int. Cl.
*H01F 6/02* (2006.01)
*H01L 39/16* (2006.01)
(Continued)

(52) U.S. Cl.
CPC .............. *H01F 6/02* (2013.01); *H01L 39/16* (2013.01); *H01L 39/249* (2013.01); *H02H 7/001* (2013.01); *H02H 9/023* (2013.01)

(58) Field of Classification Search
CPC ......... H01F 6/02; H01L 39/16; H01L 39/249; H02H 7/001; H02H 9/023
See application file for complete search history.

(56) References Cited

U.S. PATENT DOCUMENTS 5,828,291 A    10/1998 Baumann et al.
9,024,192 B2 *  5/2015 Neumuller .......... H01L 39/2464
                                                  174/11 OR
(Continued)

FOREIGN PATENT DOCUMENTS

CA    2177169 C    4/1996
EP    1622209 A1   1/2006
(Continued)

OTHER PUBLICATIONS

Search Report issued from the United Kingdom Patent Office for related Application No. GB1705214.3 dated Aug. 16, 2017 (4 pages).

(Continued)

*Primary Examiner* — Kyung S Lee
(74) *Attorney, Agent, or Firm* — Michael Best & Friedrich LLP

(57) ABSTRACT

A high temperature superconductor, HTS, tape (100) for detecting a quench in a superconducting magnet. The HTS tape comprises an HTS layer (101) of HTS material supported by a substrate (102). The HTS layer is divided into a plurality of strips (104,105,107). The strips are connected (106) in series along an open path.

21 Claims, 3 Drawing Sheets

(51) Int. Cl.
*H01L 39/24* (2006.01)
*H02H 7/00* (2006.01)
*H02H 9/02* (2006.01)

(56) References Cited

U.S. PATENT DOCUMENTS

| | | | |
|---|---|---|---|
| 10,290,399 B2* | 5/2019 | Wang | H01L 39/2458 |
| 2001/0015880 A1 | 8/2001 | Heismann | |
| 2007/0063798 A1 | 3/2007 | Bock et al. | |
| 2010/0254047 A1 | 10/2010 | Martchevskii | |
| 2011/0177953 A1 | 7/2011 | Llambes et al. | |
| 2012/0181062 A1* | 7/2012 | Neumuller | H01L 39/2464 |
| | | | 174/125.1 |
| 2013/0137579 A1* | 5/2013 | Nagasu | H01B 12/02 |
| | | | 505/150 |
| 2015/0148236 A1 | 5/2015 | Wang et al. | |
| 2015/0348682 A1 | 12/2015 | Wang et al. | |

FOREIGN PATENT DOCUMENTS

| | | |
|---|---|---|
| JP | H05327042 A | 12/1993 |
| JP | H10316421 A | 12/1998 |
| JP | 2004172485 A | 6/2004 |
| JP | 2014229753 A | 12/2014 |
| KR | 20110001214 A | 1/2011 |
| WO | 0156089 A2 | 8/2001 |
| WO | 2015116289 A2 | 8/2015 |
| WO | 2017042541 A1 | 9/2016 |

OTHER PUBLICATIONS

International search Report with Written Opinion for related Application No. PCT/GB2018/050800 dated Mar. 27, 2018 (22 pages).

* cited by examiner

U.S. Patent    Aug. 24, 2021    Sheet 2 of 3    US 11,101,059 B2
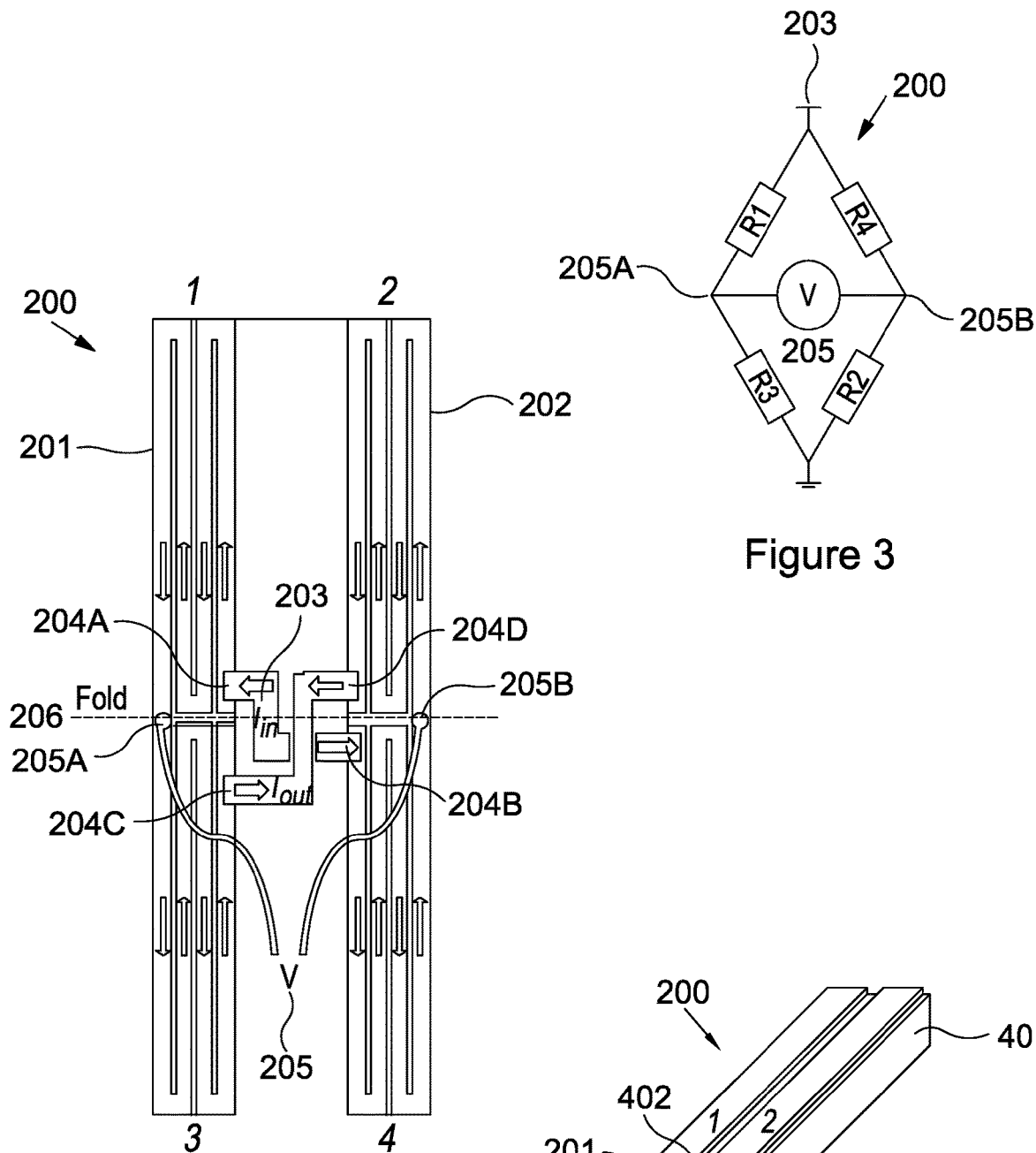
Figure 2
Figure 3
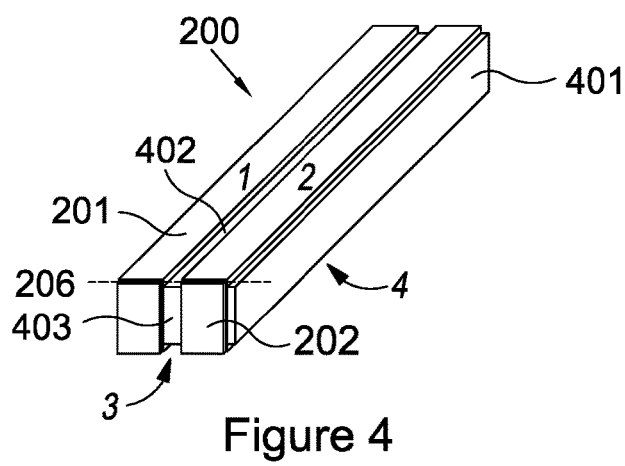
Figure 4

QUENCH DETECTION IN SUPERCONDUCTING MAGNETS

FIELD OF THE INVENTION

The invention relates to quench detection in superconducting magnets. In particular, the invention relates to methods and apparatus for identifying possible quenches so that preventative action can be taken in magnets comprising high temperature superconductor material.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach high fields with lower losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero applied magnetic field) and the critical field of the superconductor (the highest magnetic field in which the material is a superconductor at 0K). The temperature of the superconductor and the magnetic field present limit the current which can be carried by the superconductor without the superconductor becoming resistive (or "normal", used herein to mean "not superconducting"). There are two types of superconducting material: type I superconductors totally exclude magnetic flux penetration and have a low critical field, type II allow flux to penetrate the superconductor above the lower critical field within localized normal regions called flux vortices. They cease to be superconducting at the upper critical field. This feature enables them to be used in wires for construction of superconducting magnets. Significant effort is made to pin the flux vortex sites to the atomic lattice, which improves critical current at higher magnetic fields and temperatures.

Broadly speaking, there are two categories of type II superconductors. Low temperature superconductors (LTS) typically have critical temperatures (with no external magnetic field) below 20K, and high temperature superconductors (HTS) typically have critical temperatures above 40K. Many current HTS materials have critical temperatures above 77K, which allows the use of liquid nitrogen for cooling. However, it will be appreciated by those skilled in the art that LTS and HTS are differentiated by criteria other than critical temperature, and that HTS and LTS are terms of the art for certain classes of materials. In general (though not exclusively), HTS materials are ceramics, and LTS materials are metallic.

One problem which can occur in superconducting magnets is quenching. Quenching occurs when a part of the superconducting wire or coil enters the resistive state. This may occur due to fluctuations in temperature or magnetic field, or physical damage or defects in the superconductor (e.g. by neutron irradiation if the magnet is used in a fusion reactor). Due to the high currents present in the magnet, when even a small part of the superconductor becomes resistive, it quickly heats up. All superconducting wires are provided with some copper stabilizer for quench protection. The copper provides an alternative path for current if the superconductor becomes normal. The more copper that is present, the slower the temperature rises in the hot spot that forms around a region of quenched conductor.

In LTS magnets, when a quench occurs the "normal zone" will propagate rapidly—on the order of a few metres per second. This occurs due to the low heat capacity of all materials at low temperature, and the fact that LTS materials are generally operated much closer to their critical temperatures. This means that a quench propagates quickly in a LTS magnet, and the stored magnetic field energy dissipated in the quench will be spread throughout the magnet, warming it up uniformly.

HTS materials, being operated at high temperatures, have a higher specific heat capacity, so the energy required to bring a section of the wire to the normal state is much greater. This means that quenches in properly designed HTS magnets are much less likely than in LTS magnets. However, it also means that the normal zone propagation velocity is much slower—on the order of a few millimetres per second compared to metres per second in LTS magnets. Since the quench will initially only affect a small volume of the magnet, only that area will be resistive—and therefore the energy dissipated during the quench will be dumped into that small volume (or, more specifically, into the copper where the current from the normal zone is diverted). This concentration of energy can cause permanent damage to the HTS tape, e.g. melting, arc discharge, etc. This is further compounded as HTS magnets are typically indirectly cooled, rather than being immersed in a bath of liquid coolant—so the "spot" cooling power is reduced compared to LTS magnets.

The energy stored in the magnetic field is given by:

$$W = \tfrac{1}{2} \int B \cdot H \, dr$$

I.e. the greater the flux density and the higher the volume, the greater the stored energy of the magnet. The energy released by a large magnet can be on a similar order to a many kilograms of TNT. For an LTS magnet, this energy may be dissipated warming the whole magnet. For an HTS magnet of similar size without quench protection, this energy may be dissipated in a small fraction of the magnet's volume. In general a large HTS magnet will require an active quench protection system comprising a detection phase, during which the quench is detected before significant heating has occurred, followed by a dissipation phase, during which the magnet current is rapidly ramped down before the hot spot temperature rises too high.

Most HTS magnets built to date (using BSCCO and ReBCO coated conductors) do not in fact have quench protection. This is because they are mostly small, low cost prototypes, with little stored energy, and because a quench in a well-designed HTS magnet should have a very low probability, as mentioned. The decision whether to quench protect an HTS magnet is therefore essentially an economic one: a small prototype magnet can be repaired relatively easily in the rare event that it quenches. As a consequence, quench protection technology for HTS magnets is still immature.

One application of HTS magnets is in tokamak fusion reactors. An operating tokamak fusion reactor is a very "noisy" electromagnetic environment in which to make sensitive electrical measurements. This presents a problem for HTS quench detection systems because electromagnetic noise may overwhelm and obscure the typically small voltages which are indicative of a quench occurring, possibly until it is too late to take preventative action.

A quench detection system for a tokamak has been described in WO2016/052712. A length of HTS tape, referred to as "canary tape", is inserted into the magnet of the tokamak and thermally connected to the other tapes in the magnet whilst remaining electrically insulated from them. The canary tape is connected to a separate power supply and operated at a higher fraction of its critical current than the other tapes in the magnet conductor, such that it ceases to superconduct at a lower temperature than the other tapes. A voltage will develop when the temperature of the canary tape exceeds this temperature, providing a warning that a hot spot has developed and quench in the magnet is imminent or under way. However, this voltage is likely to be small and difficult to detect, especially since tokamaks inherently operate with significant electromagnetic noise. There is also a likelihood that the canary tape would be permanently damaged if the quench in the canary tape was not detected quickly enough.

SUMMARY

It is an object of the present to provide a HTS tape for detecting a quench in a superconducting magnet which addresses, or at least alleviates, the problems described above.

In accordance with one aspect of the present invention there is provided an HTS tape for detecting a quench in a superconducting magnet. The HTS tape comprises an HTS layer of HTS material supported by a substrate. The HTS layer is divided into a plurality of strips. The strips are connected in series along an open path.

The strips may be arranged to carry current in opposite directions and to be parallel and adjacent to each other and/or the the strips may be connected within the HTS layer by the HTS material.

The plurality of strips may be separated by a plurality of striations through the HTS layer. In this example, each striation has a first end extending from an end of the HTS layer and a second end terminating within the HTS layer adjacent an opposite end of the HTS layer. The first ends of successive striations extend to opposite ends of the HTS layer.

Each end of the open path connecting the strips in series may be located at a single end of the HTS layer. Alternatively, each end of the open path connecting the strips in series may be located at a single edge of the HTS layer.

The HTS material may be coated with a stabiliser layer comprising stabiliser material.

In accordance with a further aspect of the present invention there is provided a Wheatstone bridge circuit for detecting a quench in a superconducting magnet. The circuit comprises: a current supply and two half-bridge sections connected across the current supply in parallel. Each half-bridge section comprises an HTS tape as described above arranged as two non-overlapping arms connected in series at a node. Each arm comprises a continuous section of the open path of the HTS tape. The circuit further comprises a voltage sensor connected between the nodes of each half-bridge section.

The circuit may be balanced when each of the arms is at the same temperature.

The HTS tape of each half-bridge section may have each end of the open path connecting the strips in series located at a single edge of the HTS layer. The half-bridge sections may be arranged side-by-side with the ends of the open path of each of the HTS tapes adjacent one another.

In accordance with a further aspect of the present invention there is provided a quench protection system for use with a superconducting magnet. The system has at least one primary coil comprising HTS material. The system comprises: a secondary HTS tape as described above; a detection unit configured to detect onset of a loss of superconductivity in the secondary HTS tape; and a quench protection unit configured to cause energy to be dumped from the primary coil to an external resistive load in response to said detection.

The detection unit may be configured to detect onset of a loss of superconductivity in the secondary HTS tape by detecting a voltage difference in excess of a predetermined value between two points of the secondary HTS tape.

The detection unit may be configured to detect onset of a loss of superconductivity in the secondary HTS tape by detecting a rate of change of voltage difference in excess of a predetermined value between two points of the secondary HTS tape In accordance with a further aspect of the present invention there is provided a superconducting magnet comprising a primary coil and a quench protection system as described above. The primary coil comprises HTS material.

In accordance with a further aspect of the present invention there is provided a toroidal or poloidal field coil for a nuclear fusion reactor. The toroidal or poloidal field coil comprises HTS material and a quench protection system as described above.

In accordance with a further aspect of the present invention there is provided a method of manufacturing an HTS tape of the type described above. The method comprises etching the HTS layer to divide the HTS layer into strips and/or laser cutting the HTS layer to divide the HTS layer into strips and/or scribing the HTS layer to divide the HTS layer into strips.

In accordance with a further aspect of the present invention there is provided a method of protecting a superconducting magnet from quenches. The superconducting magnet has at least one primary coil comprising HTS primary coil material. The method comprises: providing a Wheatstone bridge circuit of the type described above; detecting a voltage difference between the half-bridge sections of the circuit using the voltage sensor; and in response to said detection, dumping energy from the primary coil into an external resistive load.

In accordance with a further aspect of the present invention there is provided a method of protecting a superconducting magnet from quenches. The superconducting magnet has at least one primary coil comprising HTS material. The method comprises: providing a secondary HTS tape of the type described above; detecting onset of a loss of superconductivity in the secondary HTS tape by detecting a voltage difference in excess of a predetermined value between two points of the secondary HTS tape; and in response to said detection, dumping energy from the primary coil into an external resistive load.

In accordance with a further aspect of the present invention there is provided a high temperature superconductor, HTS, tape for detecting a quench in a superconducting magnet. The HTS tape comprises an HTS layer of HTS material supported by a substrate. The HTS layer comprises a plurality of superconducting strips. The strips are connected in series along an open path.

Detecting the voltage difference may comprise applying a probe current to the secondary HTS tape, the probe current comprising an alternating current component.

The method may comprise phase sensitive detection of the voltage difference.

The amplitude of the alternating current component of the probe current may be sufficient to cause the probe current to periodically exceed a critical current at which the secondary HTS tape ceases superconducting when the temperature of the secondary HTS tape rises above a predetermined temperature value.

BRIEF DESCRIPTION OF THE DRAWINGS

FIG. 2 is a schematic illustration of a top view of an arrangement of two striated HTS probe tapes forming a Wheatstone bridge architecture;

FIG. 3 is a circuit diagram corresponding to the arrangement of FIG. 2;

FIG. 4 is a schematic perspective view of the arrangement of FIG. 2 applied to an HTS bus bar.

DETAILED DESCRIPTION

In order to provide faster and more reliable quench detection, either the noise which obscures the quench detection signal must be reduced, or the signal itself must be increased. The root cause of low sensitivity is slow quench propagation in HTS tapes, which causes HTS tapes to generate voltages that are undetectable in the electromagnetically noisy environment of a high field magnet, unless the current is driven to levels that risk destruction of the tape and other apparatus. A solution is proposed below, which provides greatly improved detection speed, voltage sensitivity and reliability compared to conventional methods and which is simple, non-destructive and inexpensive.

The solution involves the use of a specially fabricated HTS probe tape which is loaded into an HTS magnet and enables quench detection by generating a measurable voltage in response to a rise in temperature. The solution addresses the problem of low signal to noise ratio in HTS quench detection. It achieves this by splitting a probe tape into a number of strips or filaments to increase the voltage to a level which is detectable, ideally without the probe tape burning out, and reducing the pickup of electromagnetic noise. The strips may be formed by "striating" the tape i.e. by removing HTS material from the tape to form a series of channels.

Figure 1:
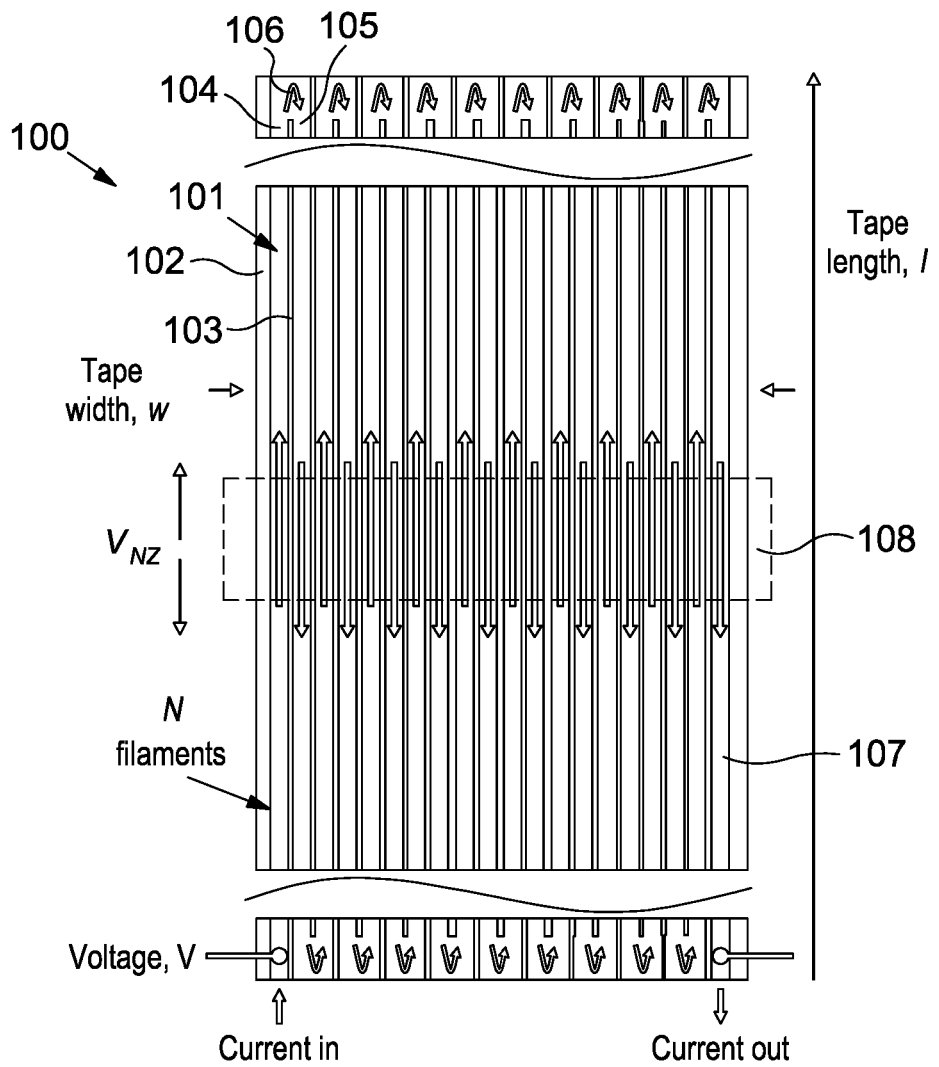
FIG. 1 is a schematic illustration of a top view of a striated HTS probe tape.

FIG. 1 shows a schematic illustration of a top view of an exemplary striated probe tape. Note that the wavy lines extending across the tape near the top and bottom of the figure are intended to indicate that sections of the tape are not shown.

The striated probe tape 100 is formed from an HTS layer 101 supported by a substrate 102, such as a stainless steel substrate. Optionally, the HTS layer may be overlaid with a stabiliser layer as described below. The probe tape 100 may be striated by, for example, etching, scribing or laser cutting through the HTS layer 101 (and any stabiliser layer, but not the substrate) along most of its length. This forms striations 103 which extend right through the HTS layer at least as far as the substrate. In practice, these striations 103 can be filled in with another material that will be insulating compared to the superconductor. In this example each striation 103 extends from one end of the tape to very nearly (but not quite) the other end, with successive striations extending to opposite ends so as to form an "alternating" pattern. This arrangement forms filaments (strips) between the striations which carry current in opposite directions and are parallel and adjacent to each other. Because the striations 103 do not go all the way to the ends of the tape, adjacent filaments 104, 105 remain joined by a superconducting bridge 106 at their ends as shown. This arrangement may be particularly beneficial in reducing inductive effects caused by current flowing in the filaments. It is of course possible to connect adjacent strips in other ways.

Alternative arrangements of the filaments may also be used. For example, the filaments may be orientated perpendicular to the length of the tape. One or more regions of the tape may have a higher density of filaments so that this region(s) is more sensitive to temperature increases. In each arrangement, however, the filaments are connected in series along an open path.

A probe current is injected into the left filament 104 and extracted at the right filament 107, causing the current to pass up and down the tape N times, where N is the number of filaments. If a local temperature rise occurs in the tape to form a "hot" zone 108, the critical current of the HTS material in this zone may fall below the probe current, causing a voltage to develop in the HTS across the locality of the temperature rise. Since the current passes through this zone 108 a total of N times, the voltage developed across the tape 100 is multiplied by a factor of N compared to a probe tape without striation.

The resistance developed by the HTS material will generate additional heat to raise the temperature further in the hot zone 108, further lowering the critical current of the HTS material, and causing the edges of the hot zone to spread along the length of the tape 100 at a velocity, $v_{NZ}$. The voltage developed across the hot zone 108 therefore increases with time as more of the HTS becomes electrically resistant. Once the hot zone 108 has begun to form, the time dependence of the measured voltage may depend only weakly on the temperature change of the HTS magnet being monitored, i.e. there may be a 'runaway' increase in the temperature of the tape. This behaviour may allow rapid detection of a potential or developing quench of the HTS magnet.

As the temperature in the hot zone 108 continues to rise the HTS material may undergo a local transition to a normal (non-superconducting) state. However, the voltage developed across the hot zone 108 may reach a detectable level before any or all of the HTS material is fully quenched in this region.

Prior to striation, the HTS layer may be wholly or partially covered by a stabiliser layer formed from a conducting material which is not an HTS, such as copper or silver. The non-zero resistance of the stabiliser layer ensures that the probe current is confined to the HTS filaments when the HTS material is superconducting. However, when the resistance of the HTS material increases, some or all of the probe current may divert into the stabiliser layer on top of the filaments and therefore generate heat therein, rather than in the HTS filaments directly, and this can further reduce the risk of them burning out. The stabiliser layer therefore contributes to the dynamical evolution of the hot zone 108 and the measurable voltage signal, e.g. as a result of the different heat capacities and resistances of the stabiliser layer and HTS filaments. In practice, there is a transition between purely superconducting and normal states which is relevant to the operation of the sensor. In the superconducting state, all of the current is carried in the HTS. In the fully quenched state, most of it is in the copper stabilizer because the resistance of the HTS is very high. In the transition these two states, the HTS has a small resistance similar to that of the copper stabiliser layer. So current is shared between the HTS and Cu and both generate heat. This heating depresses the local critical current, $I_c$. The heat generated also diffuses, preferentially along the tape (longitudinal direction), causing the hot spot to grow. The increasing temperature in the middle of the hot spot quickly causes $I_c$ to drop to zero, and that part of the hot spot goes fully normal. So a propagating hot spot comprises a normal zone in the middle, with transition zones at either end The filaments 104, 107 at the edges of the tape 100 may, as a result of the manufacturing process or handling of the probe tape, be rougher or damaged in some way compared to the filaments 103 located towards the centre of the tape. As a consequence, the edge filaments 104, 107 may have a lower critical current or a different n-value characterising their resistivity compared with the other filaments 103. This may reduce the sensitivity of the tape because, for example, when the tape warms up, a normal zone may develop in only the outermost filaments, thereby producing only a small voltage change. To mitigate this problem, the width of the outermost filaments 104, 107 may be increased and/or the outermost filaments may be surrounded on either side by a border of HTS material which is unconnected to the filaments. Similar solutions can be adopted for the ends of the tape.

Optionally, the filaments may have a width of less than 500 µm or less than 100 µm or less than 20 µm. Given their fineness, it may be difficult to make electrical connections to the filaments 104, 107 in order to supply the probe current or to make the voltage measurement. To avoid this difficulty, the filaments 104, 107 may each be (partially) expanded into a larger region or "pad" on to which the electrical connections can be more easily made.

The multi-filamentary architecture of the striated probe tape 100 may permit at least an order of magnitude increase in voltage sensitivity. It also minimises inductance, reducing voltage noise induced by fluctuating magnetic fields imposed from external sources (e.g. poloidal (PF) coils and/or plasma current in a tokamak). Signal to noise ratio may therefore be increased considerably.

In the above embodiment, the strips of the probe tape 100 are formed by striating the HTS layer, i.e. HTS material is removed from the HTS layer in order to create the strips. In an alternative embodiment the HTS material is not removed from the tape and the strips are formed by selectively damaging or degrading the HTS layer instead so that material remaining between the strips is no longer superconducting under normal operating conditions, i.e. the damaged regions or "tracks" form non-superconducting barriers in between the superconducting strips.

The non-superconducting barriers may be created by a laser lithography method. In one example, 4 mm wide HTS tape is used to fabricate the probe tape. The HTS tape is constructed with the following layers, from bottom to top: Copper (20 µm), Silver (2 µm), Hastelloy® (50 µm), buffer stack (<1 µm), Rare earth—Barium-Copper Oxide superconductor, REBCO (1-2 µm), Silver (2 µm), Cu (20 µm). The HTS tape had a critical current, $I_c$=108±2 A and an index value, n=28±2 at 77 K, self-field (sf). A laser beam is focused on to surface of the uppermost copper layer of the HTS tape and scanned over the surface in order to create the necessary pattern of strips/barriers. The intensity of the laser and/or scan rate over the surface is adjusted to be just sufficient to cause degradation of the superconducting layer in the vicinity of the laser focus. The degradation can be assessed by measuring the current-voltage, I-V, curves of sample lengths of tape which have been patterned with a microgrid of laser marks, e.g. by measuring the critical current, $I_c$, value of the samples and determining that is reduced below the critical current of the unmodified HTS tape.

Surprisingly, the superconducting layer can be degraded without the laser penetrating the uppermost copper layer, as verified by optical inspection. This allows a probe tape to be produced in which the HTS layer remains "hermetically" sealed inside the copper surround, but nevertheless has the desired electronically-filamentary structure in the HTS layer. This has considerable advantages for the handling and longevity of the probe tape, and can remove the need for Ag coating of the tape after laser lithography. A thinner uppermost layer of copper is advantageous in this regard in order to localize the heating to produce the narrowest damage tracks, although the copper must not be so thin as to cause significant ablation by the laser.

Since the probe tape 100 is intended for quench detection, its construction could be optimised for this purpose and be quite different to the HTS tapes used in, for example, a magnet of a tokamak. For example, it may be possible to increase $v_{NZ}$ by two orders of magnitude by intentionally degrading an internal HTS/Ag interface in the tape. Whilst such an approach would be unacceptable for the main magnet conductor, this may significantly enhance the ability of the probe tape to detect quenches.

Other aspects can also be optimised, such as the critical current and the thickness of the substrate and the stabiliser layer. For example, it may be preferable to use a copper stabiliser layer which is as thin as possible, e.g. less than 10 µm thick, in order to ensure a larger proportion of the probe current remains in the HTS material. In this case, 'cut-out' electronics may be required to reduce the probe current in order to prevent the tape from burning out. The probe tape 100 may also be optimised according to the range of magnetic fields in which it may be used.

Optionally, the critical temperature of the HTS may be reduced to make the critical current more temperature sensitive. This could be achieved, for example, by de-oxygenating the crystal, e.g. by performing a heat treatment on the tape under a controlled oxygen partial pressure atmosphere.

Whilst the filamentary structure reduces inductive voltages, the tape may still be susceptible to electric field pickup. This can be remedied by utilising a bridge type measurement as discussed below.

FIG. 2 shows a schematic top view of an exemplary arrangement of a Wheatstone bridge sensor 200 using a pair of striated probe tapes 201, 202 connected across a current supply 203 in parallel. Each of the tapes 201, 202 forms one half-bridge section of the Wheatstone bridge 200. Current is driven into and out of both halves of the bridge via the resistive contacts 204A-D, as indicated by the arrows labelled $I_{in}$ and $I_{out}$. The directions of the arrows indicate the current paths around each half of the bridge 200.

A differential voltage is measured using a voltage sensor 205 connected to taps (nodes) 205A-B positioned at the midpoint of each of the tapes 201, 202. In this example, the striations on each of the tapes 201, 202 are arranged to divide the tape along its length, along line 206, into two regions or "arms" (labelled in the figure as 1, 3 for tape 201 and 2, 4 for tape 202). In this exemplary arrangement, each arm comprises a continuous section of the open path of either one of the half-bridge section tapes 201, 202. The arms are connected in series so that the current injected into each of the tapes 201, 202 must flow through both arms of that tape sequentially.

FIG. 3 shows the equivalent circuit diagram for the arrangement shown in FIG. 2. The circuit has four resistors R1-4 arranged to form a Wheatstone bridge 200, with each of the resistors R1-R4 corresponding to an arm 1-4 of the tapes 201, 202. The two half-bridge sections of the Wheatstone bridge 200 are connected in parallel across the current supply 203. The voltage sensor 205 measures the voltage between the two points (nodes) 205A-B which are located between the arms (1, 3 on tape 201 and 2, 4 on tape 202). The bridge 200 is "balanced" when the ratio of the resistances for the arms 1,3 of the first tape 201 is equal to the ratio of the resistances for the arms 2,4 of the second tape 202, i.e. $R_1/R_3=R_4/R_2$. In such an arrangement, e.g. when the four arms are identical, there is no voltage between the taps 205A-B If either or both of the tapes 201, 202 starts to warm at some point along their length, the resistance of the warmer arm increases and the bridge 200 becomes unbalanced, and hence a differential voltage is produced to indicate the temperature rise. For example, if any one of the arms 1-4 starts to warm independently from the other arms then a voltage may be detected. Similarly, if arms 1 and 2 or 3 and 4 begin to warm simultaneously then a voltage may also be detected.

Any residual electric field pickup on all the arms 1-4 of the bridge 200 is subtracted by the differential measurement, thereby reducing the noise in the voltage measurement.

FIG. 4 shows schematically how the bridge 200 can be arranged to enable very sensitive quench detection. Both tapes 201, 202 can be folded at the middle (along line 206) and wrapped around a magnet conductor 401, such as an HTS bus bar. In this example, one arm 1, 2 of each of the tapes 201, 202 goes down one face 402 of a magnet conductor 401 and the other arm 3,4 of each of the tapes 201, 202 goes down the opposite face. This arrangement allows hot spots to be detected from either face of the magnet conductor 401. As the opposing arms 1,2 are placed side-by-side on the face 402 of the conductor, a warmer zone developing on this face will be detected with greater sensitivity than if, for example arms 1,3 of the same half-bridge section were placed side-by-side. Additionally, as the tapes 201, 202 wrap around the end 403 of the magnet conductor 401, the bridge 200 is sensitive to temperature changes which occur in a direction perpendicular to the face 402. Arranging the arms 1-4 in this way is also convenient as all the connections are at one end 403 of the magnetic conductor 401, thereby simplifying the cabling required to operate the bridge 200 and providing convenient access to repair or replace the connections.

Instead of using two separate tapes, the half-bridge sections can optionally be formed on a single substrate.

Figure 5:
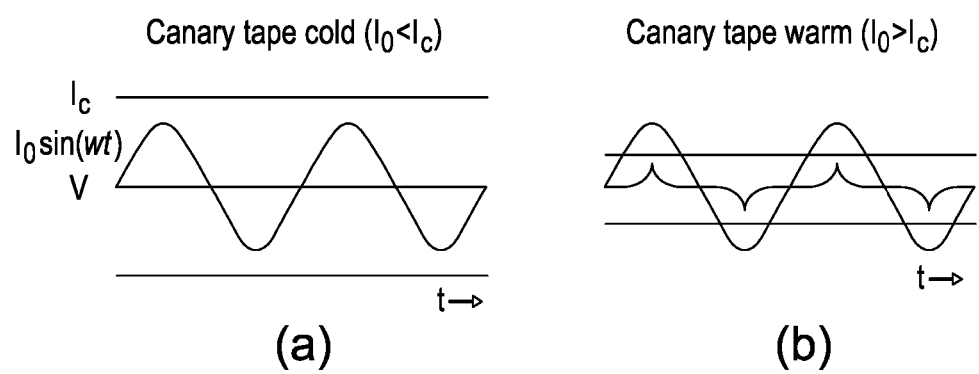
FIG. 5 is a schematic illustration of a voltage measurement for a probe tape with an alternating probe current applied.

FIG. 5 shows a schematic illustration of a phase sensitive detection technique to increase measurement sensitivity.

FIG. 5(a) shows an exemplary waveform of an alternating current (AC) probe current, $I_0 \sin \omega t$, which is applied to a probe tape, such as a striated probe tape. The amplitude $I_0$ of the AC probe is chosen to be less than the critical current $I_c$ of the probe tape when the tape is "cold" i.e. before a quench has occurred. Under these conditions the tape remains superconducting so that the voltage waveform V (measured across the tape) remains zero (or constant) over time, i.e. over many cycles of the AC probe.

FIG. 5(b) shows the same probe current waveform and a modified voltage waveform when the probe tape is "warm" and has a lower critical current, e.g. due to a temperature rise in or around a superconducting magnet adjacent to the tape. In this case, the probe current exceeds the critical current for some fraction of the AC period, $2\pi/\omega$. When this occurs there is resistive heating of the tape which causes a modulation of the voltage waveform. As this modulation occurs at the frequency of the AC component, phase sensitive ("synchronous") detection techniques can be used to increase the sensitivity of the voltage measurement, e.g. a lock-in amplifier can be used to increase the signal-to-noise ratio of the measurement.

A direct current (DC) component may be added to the AC probe in order to bring the current in the probe tape closer to the critical current, whilst simultaneously allowing a smaller AC amplitude to be used. For example, the amplitude of the DC component may be set to 90% of the critical current when the tape is cold. The AC component can then be adjusted to bring the total current above the critical current for a short period during each AC cycle.

If the DC component is set to be too close to the critical current then upward drifts in the DC component may cause heating of the tape, possibly leading to false alarms and/or spurious quenches of the tape. To avoid this problem, the DC current may be supplied to the probe tape by a closed-loop circuit which uses a feedback loop to control the DC current so as to maintain a constant AC voltage across the probe tape.

The time dependence of the DC current supplied by the closed-loop circuit can be monitored to differentiate between routine variations associated with, for example, the electronic equipment and a temperature changes occurring in the probe tape, e.g. by filtering and/or integration with a microcontroller. For example, an unexpected change in temperature of the magnet, e.g. indicating the onset of a quench, would cause a sudden (unexpected) fall in the critical current of the probe tape. The temperature change may therefore be detected preferentially by monitoring the rate of change of the current supplied by the close-loop circuit.

Although in the example shown in FIG. 5 the AC component is sinusoidal, other types of waveform may be used. In particular, the waveform parameters can be varied so that damage to the probe tape is avoided, whilst maximising the voltage modulation, e.g. by ensuring the AC probe current is well above the critical current, but is only delivered in short pulses.

Optionally, the amplitude of the AC probe may be 10%, 50% or 90% of the critical current of the probe tape under stable magnet conditions. This amplitude may be chosen to ensure that suitable temperature sensitivity is achieved whilst ensuring that there is sufficient stability to avoid premature quenching of the probe tape. Optionally, the frequency of the AC probe current may be in the range 1-1000 Hz.

While various embodiments of the present invention have been described above, it should be understood that they have been presented by way of example, and not limitation. It would be apparent to one skilled in the relevant art(s) that various changes in form and detail could be made therein without departing from the spirit and scope of the invention. Thus, the present invention should not be limited by any of the above-described exemplary embodiments, but should be defined only in accordance with the following claims and their equivalents.

The invention claimed is:

1. A quench protection system for use with a superconducting magnet having at least one primary coil comprising high temperature superconductor, HTS, material, the system comprising:
   a secondary HTS tape, the secondary HTS tape comprising an HTS layer of HTS material supported by a substrate, the HTS layer being divided into a plurality of strips, the strips being connected in series along an open path;

a detection unit configured to detect onset of a loss of superconductivity in the secondary HTS tape; and a quench protection unit configured to cause energy to be dumped from the primary coil to an external resistive load in response to said detection.

2. A quench protection system according to claim 1, wherein the strips are arranged to carry current in opposite directions and to be parallel and adjacent to each other.

3. A quench protection system according to claim 1, wherein the strips are connected within the HTS layer by the HTS material.

4. A quench protection system according to claim 3, wherein the plurality of strips are separated by a plurality of striations through the HTS layer, each striation having a first end extending from an end of the HTS layer and a second end terminating within the HTS layer adjacent an opposite end of the HTS layer, the first ends of successive striations extending to opposite ends of the HTS layer.

5. A quench protection system according to claim 3, wherein the plurality of strips are separated by non-superconducting barriers of the HTS material.

6. A quench protection system to claim 5, wherein the non-superconducting barriers are non-superconducting as a result of thermal damage to the HTS material.

7. A quench protection system according to claim 1, wherein each end of the open path connecting the strips in series is located at a single end of the HTS layer.

8. A quench protection system according to claim 1, wherein each end of the open path connecting the strips in series is located at a single edge of the HTS layer.

9. A quench protection system according to claim 1, wherein the HTS material is coated with a stabiliser layer comprising stabiliser material.

10. A Wheatstone bridge circuit for detecting a quench in a superconducting magnet, the circuit comprising:
a current supply;
two half-bridge sections connected across the current supply in parallel, each half-bridge section comprising an HTS tape according to claim 1 arranged as two non-overlapping arms connected in series at a node, each arm comprising a continuous section of the open path of the HTS tape; and
a voltage sensor connected between the nodes of each half-bridge section.

11. A circuit according to claim 10, wherein the circuit is balanced when each of the arms is at the same temperature.

12. A circuit according to claim 10, wherein in the HTS tape of each half-bridge section, each end of the open path connecting the strips in series is located at a single edge of the HTS layer and the half-bridge sections are arranged side-by-side with the ends of the open path of each of the HTS tapes adjacent one another.

13. A method of protecting a superconducting magnet from quenches, the superconducting magnet having at least one primary coil comprising high temperature superconductor, HTS, primary coil material, the method comprising:
providing a Wheatstone bridge circuit according to any claim 10;
detecting a voltage difference between the half-bridge sections of the circuit using the voltage sensor; and
in response to said detection, dumping energy from the primary coil into an external resistive load.

14. A quench protection system according to claim 1, wherein the detection unit is configured to detect onset of a loss of superconductivity in the secondary HTS tape by detecting a voltage difference in excess of a predetermined value between two points of the secondary HTS tape.

15. A quench protection system according to claim 1, wherein the detection unit is configured to detect onset of a loss of superconductivity in the secondary HTS tape by detecting a rate of change of voltage difference in excess of a predetermined value between two points of the secondary HTS tape.

16. A superconducting magnet comprising a primary coil and the quench protection system according to claim 1, the primary coil comprising high temperature superconductor, HTS, material.

17. A toroidal or poloidal field coil for a nuclear fusion reactor, the toroidal or poloidal field coil comprising high temperature superconductor, HTS, material and a quench protection system according to claim 1.

18. A method of protecting a superconducting magnet from quenches, the superconducting magnet having at least one primary coil comprising high temperature superconductor, HTS, material, the method comprising:
providing a quench protection system according to claim 1;
detecting onset of a loss of superconductivity in the secondary HTS tape of the quench protection system by detecting a voltage difference in excess of a predetermined value between two points of the secondary HTS tape; and
in response to said detection, dumping energy from the primary coil into an external resistive load.

19. A method according to claim 18, wherein detecting the voltage difference comprises applying a probe current to the secondary HTS tape, the probe current comprising an alternating current component.

20. A method according to claim 19 and comprising phase sensitive detection of the voltage difference.

21. A method according to claim 19, wherein the amplitude of the alternating current component of the probe current is sufficient to cause the probe current to periodically exceed a critical current at which the secondary HTS tape ceases superconducting when the temperature of the secondary HTS tape rises above a predetermined temperature value.

* * * * *